(12) United States Patent
Aritome (10) Patent No.: US 7,463,520 B2
(45) Date of Patent: Dec. 9, 2008

(54) MEMORY DEVICE WITH VARIABLE TRIM SETTINGS

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 11/277,436

(22) Filed: Mar. 24, 2006

(65) Prior Publication Data

US 2007/0223278 A1    Sep. 27, 2007

(51) Int. Cl.
G11C 11/34    (2006.01)
(52) U.S. Cl. .............................. 365/185.12; 365/185.18
(58) Field of Classification Search ............ 365/185.18, 365/185.28
See application file for complete search history.

(56) References Cited

U.S. PATENT DOCUMENTS

| | | | |
|---|---|---|---|
| 5,801,985 A * | 9/1998 | Roohparvar et al. | ... 365/185.01 |
| 7,160,284 B2 * | 1/2007 | Ullestad et al. | .......... 604/891.1 |
| 2003/0031056 A1 * | 2/2003 | Roohparvar | ........... 365/185.22 |
| 2005/0122831 A1 | 6/2005 | Roohparvar | |
| 2006/0015691 A1 * | 1/2006 | Louie et al. | ................. 711/154 |
| 2006/0256620 A1 * | 11/2006 | Nguyen et al. | ......... 365/185.28 |
| 2007/0047315 A1 * | 3/2007 | Aritome | ................ 365/185.18 |

* cited by examiner

*Primary Examiner*—Michael T Tran
(74) *Attorney, Agent, or Firm*—Dorsey & Whitney LLP (57) ABSTRACT

A memory device includes a memory array including a plurality of cells. The cells are divided into a plurality of subsets. Each subset has at least one associated trim parameter. The trim parameter for each subset is stored in the memory array within the associated subset. Circuitry is operable to program at least a portion of a selected subset using the associated trim parameter. A method for operating a memory device includes storing at least one trim parameter for each of a plurality of subsets of a memory array in the memory device within each of the subsets. At least a portion of a selected subset is programmed based on the at least one trim parameter associated with the selected subset.

28 Claims, 5 Drawing Sheets

MEMORY DEVICE WITH VARIABLE TRIM SETTINGS

CROSS-REFERENCE TO RELATED APPLICATIONS

Not applicable.

STATEMENT REGARDING FEDERALLY SPONSORED RESEARCH OR DEVELOPMENT

Not applicable

BACKGROUND OF THE INVENTION

The present invention relates generally to memory devices and, more particularly, to a memory device with variable trim settings.

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in portable electronic devices because it enables the manufacturer to support new communication protocols as they become standardized and to provide the ability to remotely upgrade the device for enhanced features.

A typical flash memory includes a memory array having a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate. Within each block, cells may be further grouped by page. Each page is associated with a particular word line of the array.

NOR and NAND flash memory devices are two common types of flash memory devices, so called for the logical form of the basic memory cell configuration in which each is arranged. Typically, for NOR flash memory devices, the control gate of each memory cell of a row of the array is connected to a word line, and the drain region of each memory cell of a column of the array is connected to a bit line. The memory array for NOR flash memory devices is accessed by a row decoder activating a row of floating gate memory cells by selecting the word line connected to their control gates. The row of selected memory cells then place their data values on the column bit lines by flowing a differing current, depending upon their programmed states, from a connected source line to the connected column bit lines.

An array of memory cells for NAND flash memory devices is also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Memory devices usually include trim circuits that are programmed to output bit values used to provide a variety of options for algorithms that control the operations of the memory device. Such algorithm options may include timing, pulse counts, applied voltage levels, etc. The trim bit values are usually programmed once for a memory device and are rarely changed once the memory device has reached production. Moreover, the bit values are usually applied globally to an entire memory array, which can include thousands of memory blocks, especially for NAND devices. However, as memory array sizes increase, applying the bit values globally to an entire memory array may not be sufficient. Performance variations exist across the array due to factors such as critical dimension (CD) variation within the die and inside NAND strings. Hence, it is difficult to determine a single trim set that may be applied to the entire array.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a memory device including a memory array including a plurality of cells. The cells are divided into a plurality of subsets. Each subset has at least one associated trim parameter. The trim parameter for each subset is stored in the memory array within the associated subset. Circuitry is operable to program at least a portion of a selected subset using the associated trim parameter.

Another aspect of the present invention is seen a method for operating a memory device. The method includes storing at least one trim parameter for each of a plurality of subsets of a memory array in the memory device within each of the subsets. At least a portion of a selected subset is programmed based on the at least one trim parameter associated with the selected subset.

BRIEF DESCRIPTION OF THE SEVERAL VIEWS OF THE DRAWINGS

The invention will hereafter be described with reference to the accompanying drawings, wherein like reference numerals denote like elements, and.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
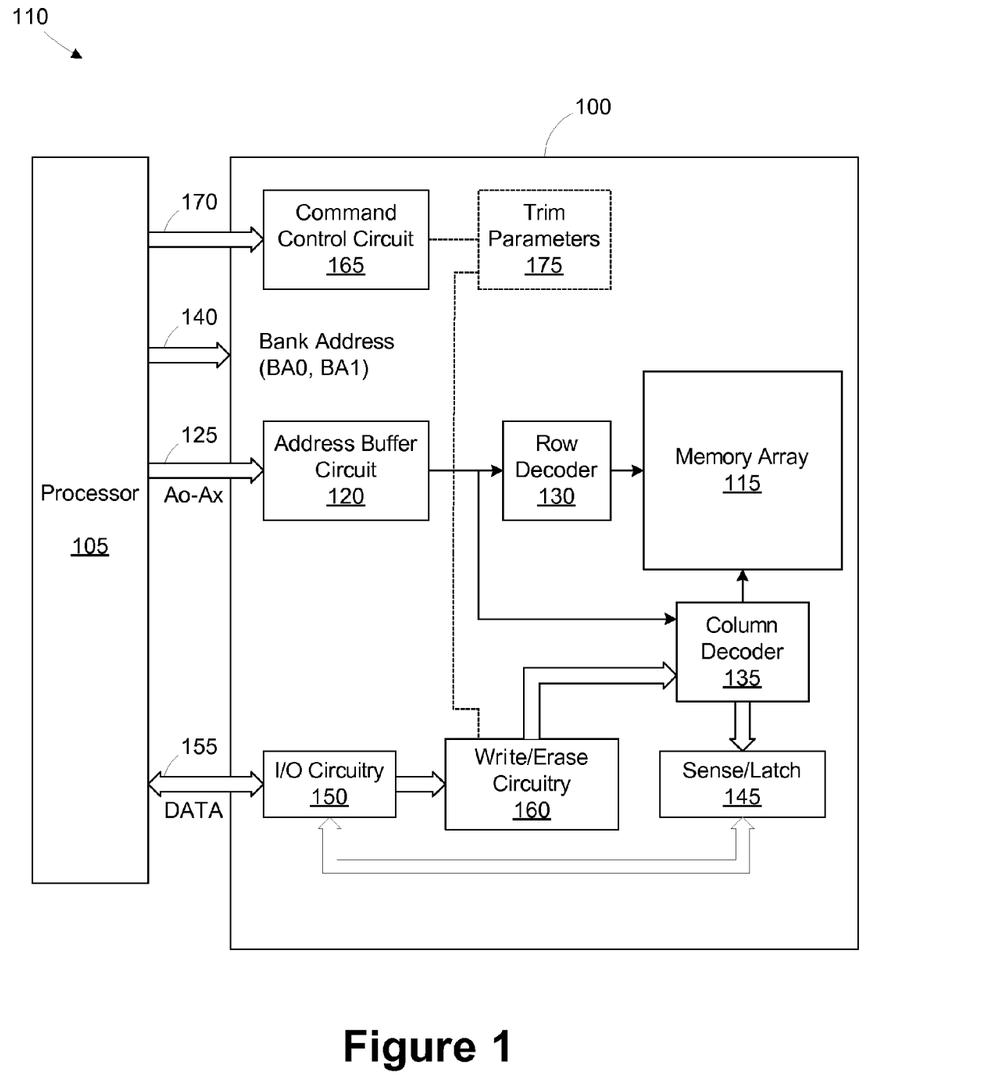
FIG. 1 is a simplified block diagram of a memory device in accordance with one illustrative embodiment of the present invention.

Referring now to the drawings wherein like reference numbers correspond to similar components throughout the several views and, specifically, referring to FIG. 1, the present invention shall be described in the context of an exemplary flash memory device 100 coupled to a processor 105. The flash memory device 100 and the processor 105 may form part of an electronic system 110. The flash memory device 100 has been simplified to focus on features of the memory that are helpful in understanding the present invention. A more detailed understanding of internal circuitry and functions of flash memories are known to those skilled in the art.

The flash memory device 100 includes an array 115 of memory cells. The memory cells are non-volatile floating-gate memory cells and may employ a NAND or NOR topology. The memory array 115 is arranged in banks of rows and columns. An address buffer circuit 120 is provided to latch address signals provided on address input connections A0-Ax 125. Address signals are received and decoded by a row decoder 130 and a column decoder 135 to access the memory array 115. It will be appreciated by those skilled in the art, with the benefit of the present description, that the number of address input connections depends on the density and architecture of the memory array 115. That is, the number of addresses increases with both increased memory cell counts and increased bank and block counts.

Bank address lines 140 are used to access the different banks of the memory array 115. The number of banks may vary. For example, four memory banks may be provided. In such an embodiment, two bank address lines, BA1 and BA0, are required to activate a selected one of the memory banks. For example, if the memory banks are designated as Bank0 . . . Bank3, and memory bank 3 is desired to be activated, then the bank address lines are set to BA1=1 and BA0=1. If a memory embodiment has different quantities of memory banks, different quantities of bank select lines will be required.

The flash memory device 100 reads data in the memory array 115 by sensing voltage or current changes in the memory array columns using sense/latch circuitry 145. In one embodiment, the sense/latch circuitry 145 is coupled to latch a row of data from the memory array 115. Data input and output buffer circuitry 150 is included for bidirectional data communication over a plurality of data (DQ) connections 155 with the processor 105. Write/erase circuitry 160 is provided to write data to the memory array 115 or to erase the data programmed therein.

A command control circuit 165 decodes signals provided on control connections 170 from the processor 105. In one embodiment, the command control circuit 165 is implemented using a state machine that executes the functions of the memory array 115, including data read, data write, and erase operations. The state machine may also be responsible for executing the functions required for either a virtual synchronous flash memory function or a synchronous flash memory function, depending on the control word.

The processor 105 generates signals on the address, data, and control lines to the memory device 100. Alternate embodiments may use other controllers to generate these signals. Additionally, the memory device 100 may be coupled to something other than a controller or processor that generates the address, data, and control signals.

The command control circuit 165 in cooperation with the write/erase circuitry 160 employs variable trim parameters 175 for adjusting the parameters of the signals used for accessing, programming, or erasing the memory array 115 depending on the particular performance characteristics across the memory array 115. For example, parameters such as program start voltage (Vpgm_start), program step voltage (Vpgm_step_up), program pulse width, inhibit pulse width, erase start voltage (Verarse_start), erase step voltage (Verase_step), erase pulse width, etc., may be varied. In the illustrated embodiment different trim settings may be applied to different subsets of the memory array 115. For example, trim parameters 175 may be applied to a group of blocks, a single block, or pages within a block. The level to which trim parameters 175 are set depends on the particular characteristics of the memory array 115 and the expected performance variation across the array. Typically, the trim parameters are determined using a testing process performed during or after the fabrication of the memory device 100.

In the illustrated embodiment, the memory array 115 is programmed using an incremental step pulse programming technique, where multiple short pulses are applied to the cells being programmed. After each pulse, the contents are verified to determine if the device is successfully programmed. If the verify step fails, the voltage of the pulse is increased, and the program/verify operation is repeated iteratively. The incremental pulse technique reduces the likelihood that the cells will be over-programmed (i.e., exposed to a higher than necessary voltage), which can reduce the reliability of the device and shorten its operating life. The trim parameters 175 specify a starting program voltage, a step size, and a pulse width for the incremental step pulse programming technique. An erase operation may also be performed using an incremental pulse technique, with additional trim parameters 175 being provided to specify the starting erase voltage, step size, and pulse width for the erase cycle.

Figure 2:
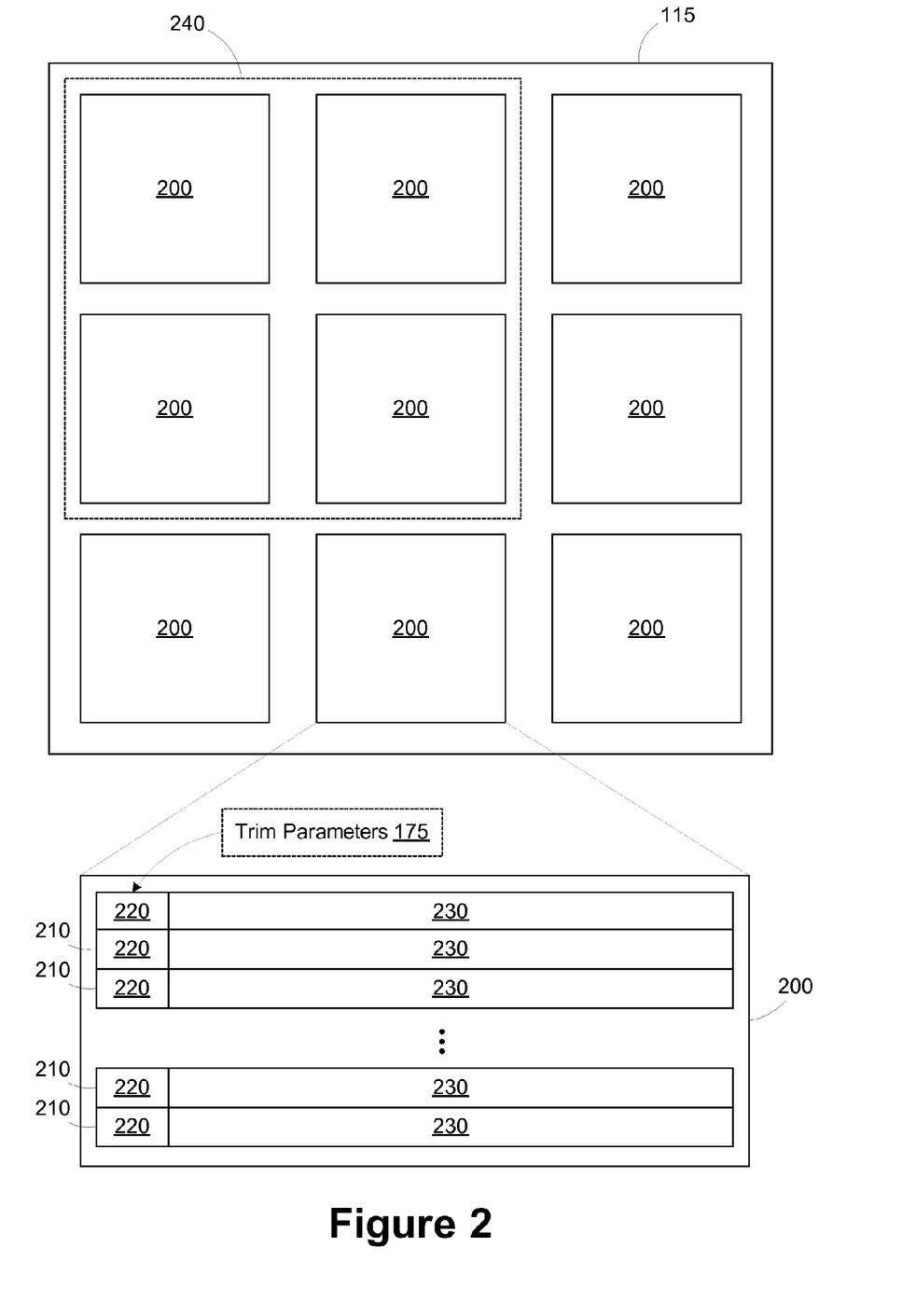
FIG. 2 is a diagram illustrating the organization of a memory array in the device of FIG. 1.

Turning now to FIG. 2, a simplified diagram illustrating the organization of the memory array 115 is provided. The memory array 115 includes a plurality of blocks 200. Each block 200 includes a plurality of pages 210. Each page 210 includes a control region 220 and a data region 230. The user data written to the memory array 115 is stored in the data region 230. The control region 220 is reserved for user purposes, such as for storing error correction codes (ECC), but is not available for storing user data. For example, an exemplary memory array may have a control region 220 of 64 bytes and a data region 230 of 2048 bytes defined for each page. The capacity of the memory array 115 is determined by the size of the data region 230 across all the pages 210, blocks 200, and banks. In the illustrated embodiment, the trim parameters 175 for the memory array 115 are stored in the control region 220 for the associated page 210. A portion of the control region 220 (e.g., 8 bytes) may be reserved for the trim parameters 175.

The trim parameters 175 may also be defined for a larger grouping of cells in the memory array 115, such as for a plurality of pages 210, an entire block 200, or a group 240 of blocks 200. In such instances, the trim parameters 175 need not be stored in the control region 220 for each page 210, but rather in a designated location within the trim grouping. For example, if the trim grouping corresponds to a block 200, the trim parameters 175 may be stored in the control region 220 for the first page 210 in the block 200. Similarly, if the trim grouping corresponds to a group 240 of blocks 200, the trim parameters 175 may be stored in the control region 220 for the first page 210 in the first block 200 of the group 240. Of course, the location of the trim parameters 175 may be varied depending on the particular implementation, as long as they are stored somewhere within the particular subset of the memory array 115 with which they are associated. If desired, the trim parameters 175 may be duplicated in other portions of the trim grouping. For example, the trim parameters 175 may be stored in every page 210 and/or in every block 200 of a trim grouping. The trim parameters 175 may include information specifying the size of the trim grouping (e.g., page, group of pages, block, or group of blocks).

Storing the trim parameters 175 within the subset of the memory array 115 with which it is associated is convenient in that no indexing of the trim parameters 175 to associate them with their associated subset is necessary. For example, if the trim parameters 175 were to be stored in an external buffer or other data structure, it would be necessary to link the trim parameters 175 with the associated trim grouping. Having the trim parameters 175 stored within the trim grouping makes such linking unnecessary. Also, due to the potentially large number of possible blocks 200 or pages 210 in a large memory array 115, storing the trim parameters 175 externally would require significant storage resources. By storing the trim parameters 175 in the associated trim grouping, the trim parameters 175 may be read as cells within the trim grouping are programmed.

Figure 3:
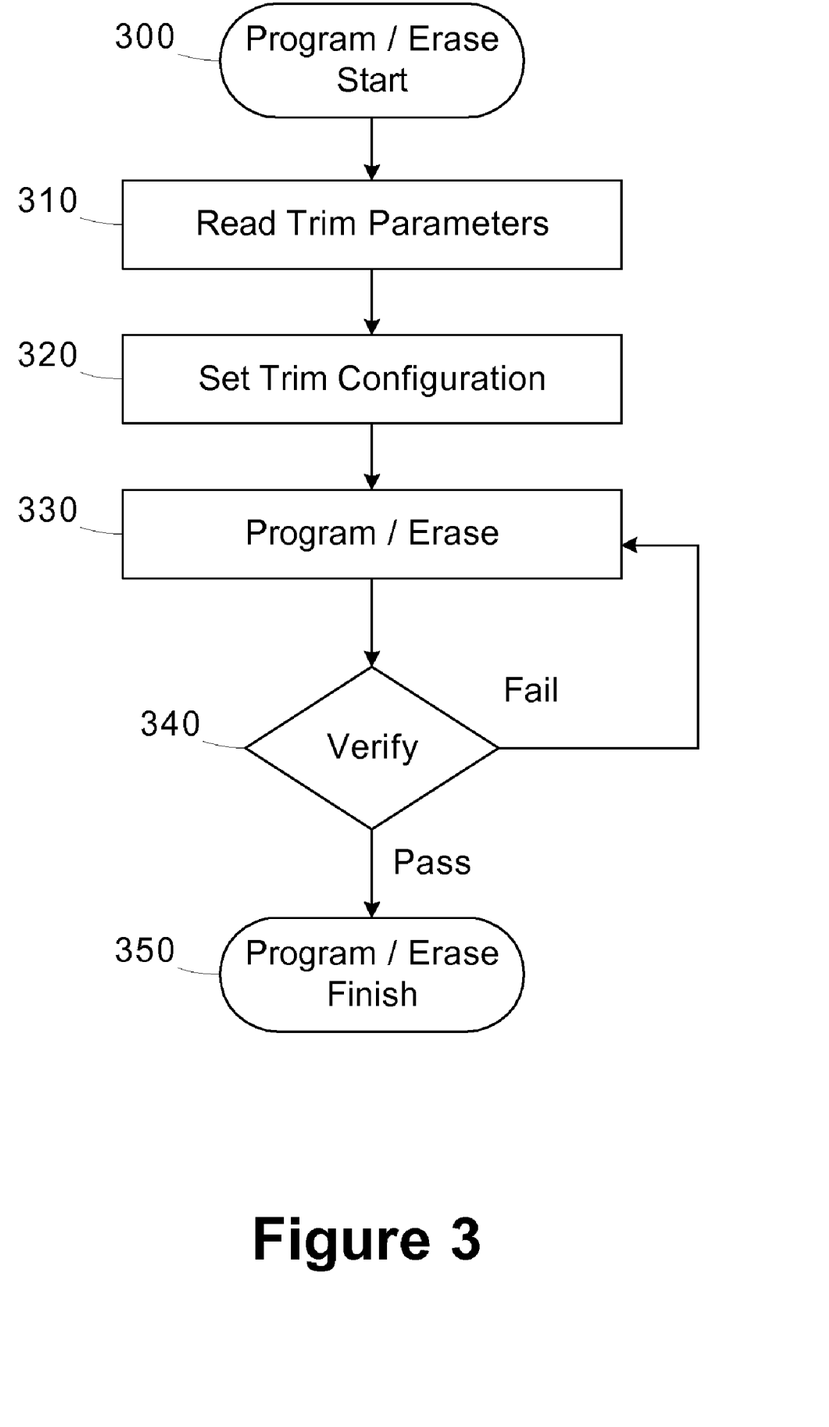
FIGS. 3-5 are simplified flow diagrams of methods for programming the memory device of FIG. 1.
Figure 4:
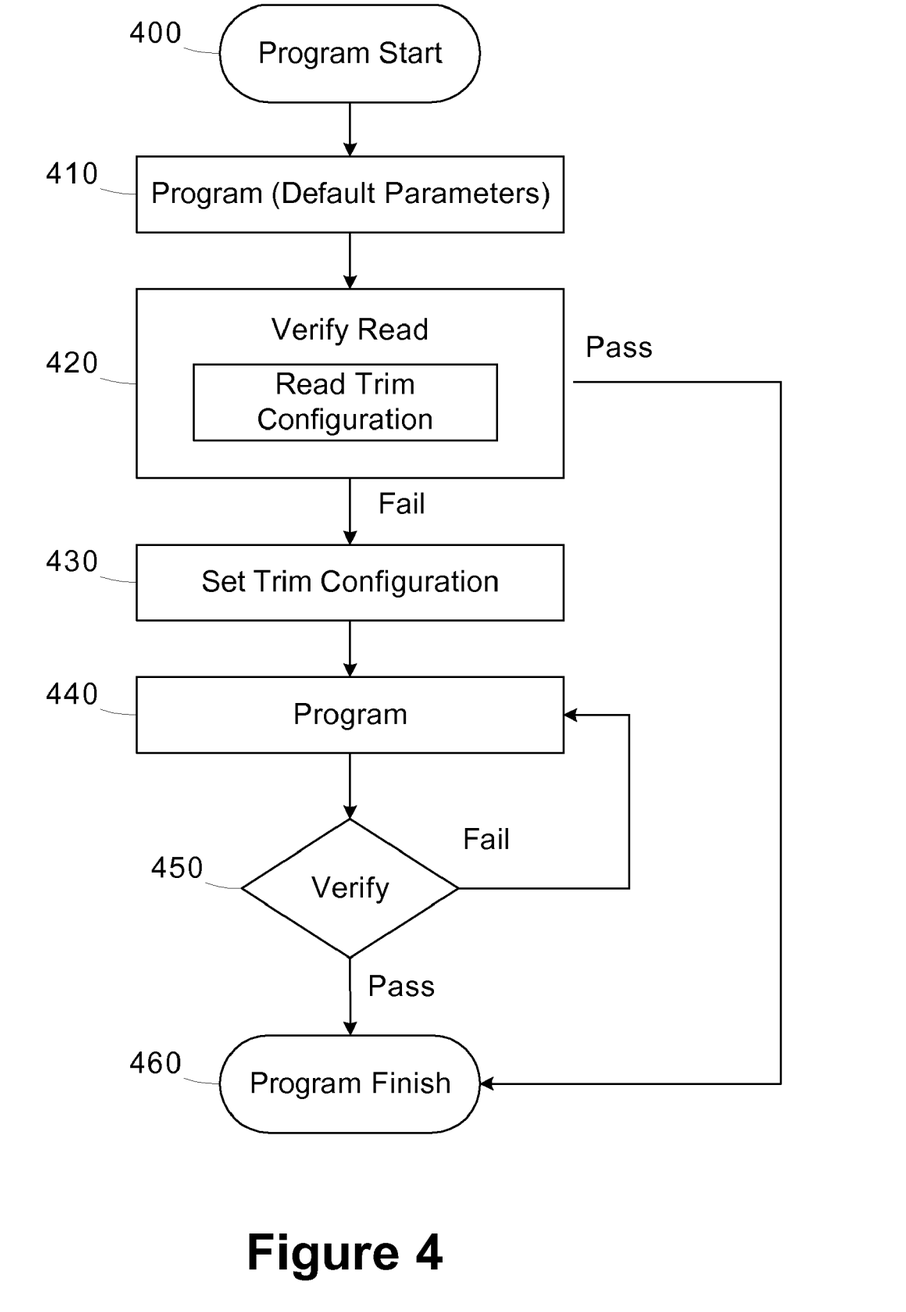
Figure 5:
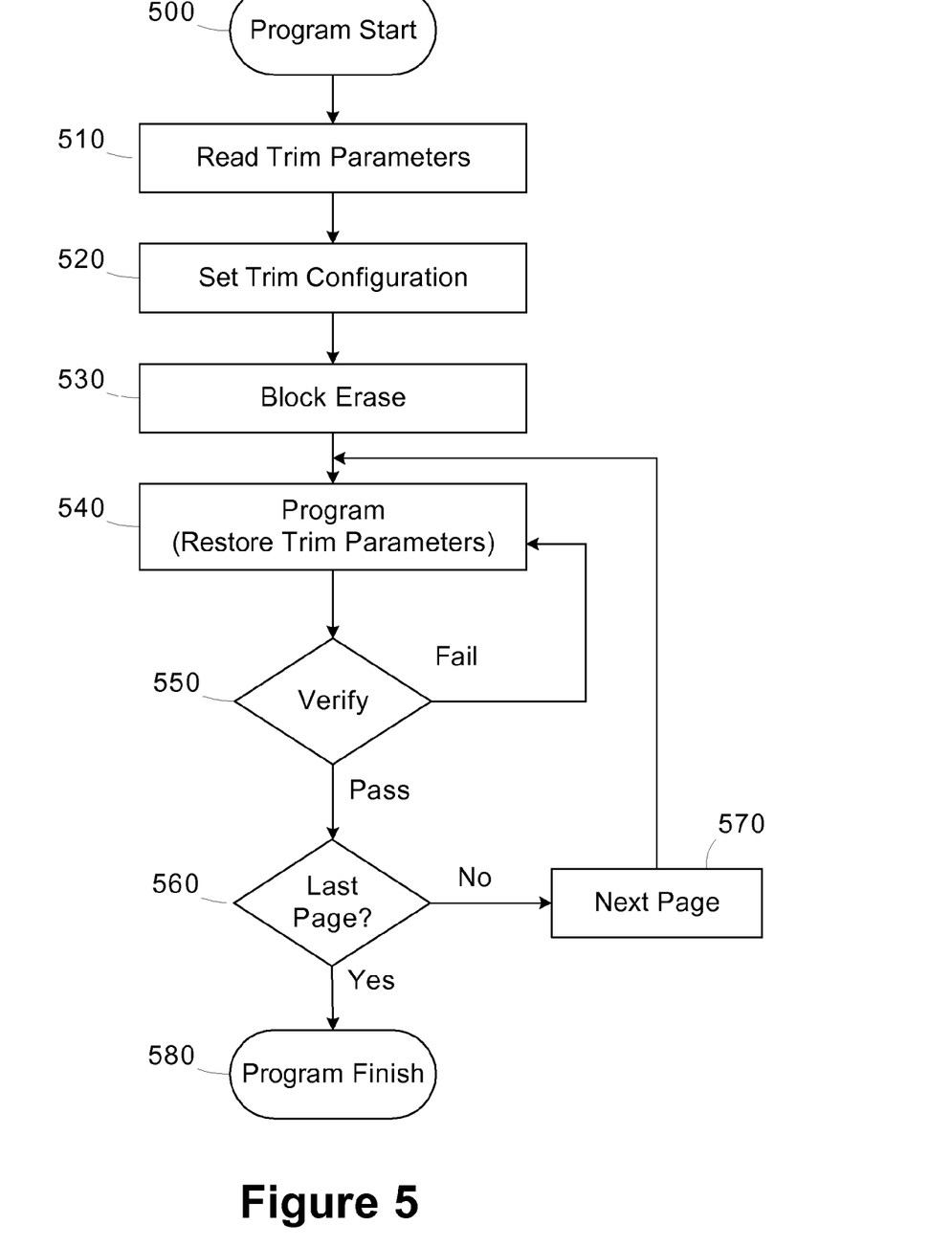

Turning now to FIGS. 3-5, simplified flow diagrams of methods for programming or erasing the memory array 115 in accordance with various embodiments of the present invention are provided. In the embodiments of FIGS. 3 and 4, the memory device 100 is programmed without an initial block erase, while in the embodiments of FIG. 5 the memory device 100 is programmed with an initial block erase. The method of FIG. 3 may also be used for erasing portions of the memory array 115. The particular programming technique employed may vary depending on the implementation and the nature of the electronic system 110. For purposes of the following examples, it is assumed that the memory device 100 is programmed one page 210 at a time, and the trim parameters 175 are stored for each page 210 within the control region 220 of the page 210.

As seen in FIG. 3, the programming or erasing of the memory array 115 begins in method block 300. In method block 310, the trim parameters are read from the control region 220 of the particular page 210 being programmed, and the command control circuit 166 and the write/erase circuitry 160 are configured to control the write/erase operations to the page 210 using the specified trim parameters 275 in method block 320. The incremental pulse programming technique is performed by the iterative program/erase and verify stages of method blocks 330 and 340, respectively. The trim parameters 175 specify the starting program/erase start voltage, the step increase for the iterative steps of the incremental technique, and the pulse width, for example. When the verify stage passes in method block 340, the program/erase cycle finishes in method block 350.

Turning now to FIG. 4, the program cycle begins in method block 400, but note that the program trim parameters 175 are not read prior to the programming. In method block 410, a first program step is completed. As the trim parameters 175 for the page 210 have not yet been determined, the command control circuit 166 and the write/erase circuitry 160 employ a predetermined default set of program parameters. Subsequently, an initial verify read is performed in method block 420. During the verify read, the trim parameters 175 are read from the page 210, and the command control circuit 166 and the write/erase circuitry 160 are configured using the trim parameters 175 in method block 430. After the trim parameters 175 are set in method block 430, the normal iterative steps of the incremental pulse programming technique are implemented in the program and verify steps of method blocks 440 and 450. The method terminates in method block 460 following a successful verify in method block 450. Of course, if the initial verify read passes in method block 420, the method also terminates in method block 460, however, this is unlikely due to the incremental pulse programming technique.

The default program parameters used in method block 410 may be selected based on the expected range of values typically for the memory array 115, and are implementation specific. For the default parameters, a relatively low program voltage and average pulse width may be applied. For example, the trim parameters 175 may specify a program voltage of 16V with a step increase of 0.6V. The default parameter is set at a lower value than is expected for the trim parameters 175 to avoid over-programming the memory array 115. In this example, a default program voltage of 15V may be used. Although the program voltage is less than what would have been used if the trim parameters 175 had been previously read (i.e., as in the method of FIG. 3), the impact on the programming is minimal, as it is used only in the first programming stage if the incremental pulse technique. Subsequent program pulses are completed using the specified trim parameters 175. Generally, the initial programming voltage may be referred to as a weak program voltage, as it is less than the expected value for the actual program voltage.

Table 1 below illustrates the program pulses employed using the methods of FIGS. 3 and 4 assuming a initial program voltage of 16V and a step increase of 0.6V specified in the trim parameters 175. For purposes of illustration, it is assumed that the programming will be completed after 5 cycles of the incremental pulse technique. Of course, the actual number of pulses may vary in an actual implementation.

TABLE 1

Incremental Pulse Programming

| Vpgm = 16 V<br>Vstep = 0.6 V | Initial Trim Read<br>(FIG. 3) | Set Trim After Verify Read<br>(FIG. 4) |
|---|---|---|
| Pulse 1 | 16 | 15<br>(Default) |
| Pulse 2 | 16.6 | 16.6 |
| Pulse 3 | 17.2 | 17.2 |
| Pulse 4 | 17.8 | 17.8 |
| Pulse 5 | 18.4 | 18.4 |

The programming method of FIG. 4 shortens the programming time for the memory array 115 as it is not necessary to perform the initial read of the trim parameters 175 prior to the programming. The trim parameters 175 are read without additional overhead during the first verify read.

Referring now to FIG. 5, a programming technique is illustrated that employs an initial block erase. In the example of FIG. 5, it is assumed for purposes of illustration only that all pages 210 of the block 200 have the same trim parameters 175, and that the trim parameters 175 are stored in the control region 220 of the first page 210. Of course, in an actual implementation, each page may have its own trim parameters 175 and the storage location may be varied as described above. The programming of the memory array 115 begins in method block 500. In method block 510, the trim parameters are read from the control region 220 of the first page 210 of the block 200 being programmed. The command control circuit 166 and the write/erase circuitry 160 are configured to control the write operations to the block 200 using the specified trim parameters 275 in method block 520. A block erase of the block 200 is performed in method block 530. The incremental pulse programming technique is performed by the iterative program and verify stages of method blocks 540 and 550, respectively. The trim parameters 175 are restored to the control region 220 of the first page 210 during the programming in method block 540. When the verify stage passes in method block 550, the programming transitions to the next page via method block 560 and repeats the program and verify stages of method blocks 540 and 550 for the next page specified in method block 570. After the last page is programmed in block 560, the method finishes in method block 580.

In some embodiments, the techniques of FIG. 3-5 may be altered, depending on the particular implementation. For example, if the trim parameters 175 are stored in one location in a larger trim grouping, the trim parameters 175 need only be read once during the programming of the grouping. Subsequent programming may be completed using the extracted trim parameters 175.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

I claim:

1. A memory device, comprising:
   a memory array including a plurality of cells, the cells being divided into a plurality of subsets, each of which corresponds to a respective block of memory cells, each subset having at least one associated trim parameter stored in the memory array within the associated subset, each block of memory cells including a plurality of pages, each of which comprises a control region and a data region, the control region of at least one of the pages storing at least one trim parameter; and
   circuitry operable to program at least a portion of a selected subset using the associated trim parameter.

2. A memory device, comprising:
   a memory array including a plurality of cells, the cells being divided into a plurality of subsets, each of which corresponds to a respective page of a respective block of memory cells, each subset having at least one associated trim parameter stored in the memory array within the associated subset, each page comprising a control region and a data region, the control region of at least one page storing at least one trim parameter; and
   circuitry operable to program at least a portion of a selected subset using the associated trim parameter.

3. The memory device of claim 1, wherein the at least one trim parameter comprises at least one of a voltage parameter and a timing parameter.

4. The memory device of claim 1, wherein the at least one trim parameter comprises a plurality of trim parameters.

5. The memory device of claim 4, wherein the trim parameters comprise at least one of a program voltage, a step voltage, a program pulse width, and an inhibit pulse width.

6. The memory device of claim 1, wherein the memory array comprises at least one of a NAND memory array and a NOR memory array.

7. The memory device of claim 1, wherein the circuitry is operable to read the trim parameter from the selected subset prior to the programming.

8. A memory device, comprising:
   a memory array including a plurality of cells, the cells being divided into a plurality of subsets, each subset having at least one associated trim parameter stored in the memory array within the associated subset; and circuitry operable to program at least a portion of a selected subset using the associated trim parameter using a plurality of program cycles, each program cycle being followed by a verify cycle, read the at least one trim parameter during a first one of the verify cycles, perform the remaining program cycles using the at least one trim parameter, and terminate the programming responsive to one of the verify cycles indicating a pass condition.

9. The memory device of claim 8, wherein the circuitry is operable to perform a first one of the program cycles using a default trim parameter prior to reading the at least one trim parameter during the first verify cycle.

10. A memory device, comprising:
a memory array including a plurality of cells, the cells being divided into a plurality of subsets, each subset having at least one associated trim parameter stored in the memory array within the associated subset; and circuitry operable to program at least a portion of a selected subset using the associated trim parameter; read the trim parameter from the selected subset prior to the programming and erase at least a portion of the selected subset after reading the at least one trim parameter and before the programming.

11. The memory device of claim 10, wherein the circuitry is operable to restore the at least one parameter to the selected subset during the programming.

12. A memory device, comprising:
a memory array including a plurality of cells, the cells being divided into a plurality of subsets, each subset having at least one associated trim parameter stored in the memory array within the associated subset, the at least one associate trim parameter comprising at least one erase trim parameter; and circuitry operable to program at least a portion of a selected subset using the associated trim parameter, and erase at least a portion of the selected subset using the erase trim parameter.

13. The memory device of claim 12, wherein the trim parameter comprises at least one of an erase voltage, an erase step voltage, and an erase pulse width.

14. A memory system, comprising:
a processor; and
a memory device coupled to the processor and operable to receive memory access commands from the processor, the memory device comprising:
a memory array including a plurality of cells, the cells being divided into a plurality of subsets, each subset having at least one associated trim parameter stored in the memory array within the associated subset, the trim parameter comprising at least one erase trim parameter; and
circuitry operable to program at least a portion of a selected subset using the associated trim parameter, and erase at least a portion of the selected subset using the erase trim parameter.

15. The memory system of claim 14, wherein the subsets correspond to at least one of a page of the memory array, a plurality of pages of the memory array, a block of the memory array, and a plurality of blocks of the memory array.

16. method for operating a memory device, comprising:
storing at least one trim parameter for each of a plurality of subsets of a memory array in the memory device within each of the subsets; and programming at least a portion of a selected subset based on the at least one trim parameter associated with the selected subset, the act of programming comprising:
programming the portion of the selected subset using a plurality of program cycles, each program cycle being followed by a verify cycle;
performing a first one of the program cycles using a default trim parameter;
after performing the first one of the program cycles, reading the at least one trim parameter during a first one of the verify cycles;
performing the remaining program cycles using the at least one trim parameter; and
terminating the programming responsive to one of the verify cycles indicating a pass condition.

17. A method for operating a memory device, comprising:
storing at least one trim parameter for each of a plurality of subsets of a memory array in the memory device within each of the subsets;
reading the trim parameter from a selected subset;
after the act of reading, erasing at least a portion of the selected subset;
after the act of erasing, programming at least a portion of the selected subset based on the at least one trim parameter associated with the selected subset.

18. The method of claim 17, further comprising restoring the at least one parameter to the selected subset during the programming.

19. The method of claim 16, wherein the subsets correspond to at least one of a page of the memory array, a plurality of pages of the memory array, a block of the memory array, and a plurality of blocks of the memory array.

20. The method of claim 16, wherein the cells are grouped into a plurality of blocks, and the subsets correspond to individual blocks of the memory array.

21. A method for operating a memory device, comprising:
storing at least one trim parameter for each of a plurality of subsets of a memory array in the memory device within each of the subsets, each subset corresponding to a respective block of memory cells, each block of memory cells including a plurality of pages, each page comprising a control region and a data region, the at least one trim parameter stored in the control region of at least one of the pages; and
programming at least a portion of a selected subset based on the at least one trim parameter associated with the selected subset.

22. The method of claim 16, wherein the memory array is arranged in a plurality of blocks, each block including a plurality of pages, and the subsets correspond to individual pages.

23. A method for operating a memory device, comprising:
storing at least one trim parameter for each of a plurality of subsets of a memory array in the memory device within each of the subsets, each subset corresponding to a respective page of a respective block of memory cells, each page comprising a control region and a data region, the at least one trim parameter stored in the control region of at least one page; and
programming at least a portion of a selected subset based on the at least one trim parameter associated with the selected subset.

24. The method of claim 16, wherein the memory array is arranged in a plurality of blocks, and the subsets correspond to groups of blocks.

25. The method of claim 16, wherein the at least one trim parameter comprises at least one of a voltage parameter and a timing parameter.

26. The method of claim 16, wherein the at least one trim parameter comprises a plurality of trim parameters.

27. A method for operating a memory device, comprising:
   storing a plurality of trim parameters for each of a plurality of subsets of a memory array in the memory device within each of the subsets, the trim parameters comprising at least one of a program voltage, a step voltage, a program pulse width, and an inhibit pulse width; and
   programming at least a portion of a selected subset based on at least one of the trim parameters associated with the selected subset.

28. A method for operating a memory device, comprising:
   storing at least one trim parameter including at least one erase trim parameter for each of a plurality of subsets of a memory array in the memory device within each of the subsets;
   erasing at least a portion of the selected subset using the erase trim parameter; and
   programming at least a portion of a selected subset based on the at least one trim parameter associated with the selected subset.

\* \* \* \* \*

UNITED STATES PATENT AND TRADEMARK OFFICE
CERTIFICATE OF CORRECTION

PATENT NO. : 7,463,520 B2
APPLICATION NO. : 11/277436
DATED : December 9, 2008
INVENTOR(S) : Aritome Page 1 of 1

It is certified that error appears in the above-identified patent and that said Letters Patent is hereby corrected as shown below:

In column 9, line 38, in Claim 12, delete "parameter," and insert -- parameter; --, therefor.

In column 9, line 57, in Claim 14, delete "parameter," and insert -- parameter --, therefor.

In column 9, line 64, in Claim 16, before "method" insert -- A --.

Signed and Sealed this

Tenth Day of February, 2009

JOHN DOLL
*Acting Director of the United States Patent and Trademark Office*